(12) United States Patent
Kitson et al.

(10) Patent No.: US 6,423,456 B1
(45) Date of Patent: Jul. 23, 2002

(54) METHOD FOR MANUFACTURE OF ELECTRONIC PARTS

(75) Inventors: Anthony Paul Kitson; Peter Andrew Reath Bennett; Kevin Barry Ray, all of West Yorkshire (GB)

(73) Assignee: Kodak Polychrome Graphics LLC, Norwalk, CT (US)

( * ) Notice: Subject to any disclaimer, the term of this patent is extended or adjusted under 35 U.S.C. 154(b) by 0 days.

(21) Appl. No.: 09/807,084

(22) PCT Filed: Oct. 9, 1999

(86) PCT No.: PCT/GB99/03308

§ 371 (c)(1),
(2), (4) Date: Apr. 9, 2001

(87) PCT Pub. No.: WO00/20222

PCT Pub. Date: Apr. 13, 2000

(30) Foreign Application Priority Data

Oct. 7, 1998 (GB) ............................................. 9821756

(51) Int. Cl.$^7$ ........................... G03F 7/039; G03F 7/09; G03F 7/16; G03F 7/30
(52) U.S. Cl. .................. 430/17; 430/270.1; 430/275.1; 430/277.1; 430/311; 430/326; 430/909; 430/910; 430/919; 430/920; 430/964; 216/49; 427/592

(58) Field of Search ................................. 430/964, 909, 430/910, 17, 919, 920, 270.1, 277.1, 275.1, 311, 326; 216/49; 427/592

(56) References Cited

U.S. PATENT DOCUMENTS 5,641,608 A 6/1997 Grunwald et al. .......... 430/964

FOREIGN PATENT DOCUMENTS

WO 9739894 10/1997

OTHER PUBLICATIONS

J.C. Streiter, Kodak Microlectronics Seminar Proceedings, 1979, p. 116.

*Primary Examiner*—Richard L. Schilling
(74) *Attorney, Agent, or Firm*—Baker Botts L.L.P.

(57) ABSTRACT

A composition used as a resist in the manufacture of electronic parts, for example printed circuits, and which is rendered soluble in a developer by patternwise delivery of heat, comprises a polymer of general formula (I), wherein $R^1$ represents a hydrogen atom or alkyl group, $R^2$ represents a hydrogen atom or alkyl group, $R^3$ represents a hydrogen atom or alkyl group, and $R^4$ represents hydroxyalkyl group, and wherein the ratio n/m is in the range 10/1 to 1/10.

15 Claims, 3 Drawing Sheets

METHOD FOR MANUFACTURE OF ELECTRONIC PARTS

CROSS-REFERENCE TO RELATED APPLICATIONS

This application claims priority from PCT/GB99/03308, which published in English on Apr. 13, 2000, which in turn claims priority from GB 9821756.5.

This invention relates to electronic parts and to their production using positive working radiation sensitive compositions.

We have developed novel radiation sensitive compositions and in our earlier-filed patent, application PCT/GB97/01117, published on Oct. 30, 1997, we disclose these novel compositions and their use as imagable coatings for lithographic printing form precursors. We later determined that such compositions are suitable as radiation sensitive coatings for printed circuit and other electronic part precursors. However they are not optimal for use as coatings on all electronic part precursors. In particular, they are not optimal for use as coatings on thin, flexible substrates which are the precursors for some electronic parts and they are not optimal for use on substrates required to be coated and imaged on both sides. For such applications we have sought a composition which can better withstand flexure and surface contact, without becoming scratched, cracked, flaked or delaminated. We have now devised a particular class of heat sensitive compositions which are extremely suitable for such applications.

The coatings used in pattern forming methods for electronic parts such as printed circuits are classified into two types: negative working and positive working. After exposure to radiation and development, the coating pattern is used as a screen for forming the patterns onto the underlying electronic elements—for example by etching an underlying copper foil. Due to the high resolution demands and the requirements of high resistance to etching techniques, positive working systems are widely used. In particular, in the main there have been used alkali developable positive working coatings mainly composed of alkali-soluble novolac resins as disclosed in J. C. Streiter, Kodak Microelectronics Seminar Proceedings, 1979, p. 116. The primary active component of such positive working compositions, both in the context of lithographic printing forms and electronic parts, is a naphthoquinonediazide (NQD) derivative.

The types of electronic parts whose manufacture may use a radiation sensitive coating include printed wiring boards (PWBs), thick- and thin-film circuits, comprising passive elements such as resistors, capacitors and inductors; multichip devices (MDCs); integrated circuits (ICs); and active semiconductor devices. The electronic parts may suitably comprise conductors, for example copper board; semiconductors, for example silicon or germanium; and insulators, for example silica as a surface layer with silicon beneath, with the silica being selectively etched away to expose portions of the silicon beneath (a step in the manufacture of e.g. field effect transistors).

A composition for use in the present invention is heat-sensitive in that localised heating of the composition, preferably by suitable radiation, causes an increase in the aqueous developer solubility of the exposed areas.

Therefore according to one aspect of the present invention there is provided a method of making an electronic part, the method comprising the steps of:

a) delivering heat selectively to regions of a precursor of the electronic part, the precursor comprising a surface carrying a coating, the coating comprising a heat-sensitive composition itself comprising an aqueous developer soluble polymeric substance and a compound which reduces the aqueous developer solubility of the polymeric substance (hereinafter called the "reversible insolubilizer compound") wherein the aqueous developer solubility of the composition is increased by the said delivery of heat; and b) developing the precursor in a said aqueous developer in order to remove the heat-sensitive composition in regions to which said heat was delivered;

wherein the aqueous developer soluble polymeric substance comprises a polymer of general formula (I)

wherein $R^1$ represents a hydrogen atom or alkyl group, $R^2$ represents a hydrogen atom or alkyl group, $R^3$ represents a hydrogen atom or alkyl group, and $R^4$ represents an alkyl or hydroxyalkyl group, and wherein the ratio n/m is in the range 10/1 to 1/10.

We have found the method set out above, using a polymer of formula I, to be a very effective one. The precursors we have used in such a method have excellent performance, with good imaging and development qualities and, at the same time, good mechanical properties, for example excellent flexibility, peel resistance, crack resistance and scratch resistance. Heretofore, despite considerable efforts, using other polymeric substances, we did not find it possible to optimise imaging and development qualities whilst maintaining the mechanical properties required of an electronic part precursor, in particular of an electronic part precursor of a thin flexible nature and/or which is coated on both sides. Furthermore the imaging and development qualities are stable over a useful time frame, whereas with some compositions we have tested, we have found that they become considerably more insoluble, in a given developer, as a function of time after coating, to the extent that they are not of practical utility.

The electronic part precursor may, for example, be a precursor for any of the electronic parts set out earlier in this specification. The said surface may thus be a semiconductor in which case the method may involve one or more subsequent doping steps selectively in regions in which the composition has been removed, such doping steps being for example by vapour phase, liquid immersion or by ion implantation methods. It may be an insulator which is etched to reveal a conductive or semiconductor layer below. For example it may be silica etched to reveal silicon. Alternatively it may be a conductive surface on which a wiring pattern is to be formed, for example by etching the printed circuit precursor in an etchant to remove said conductive surface selectively in the said regions. Preferably, when the surface is conductive it is a copper or a copper-rich alloy. Preferably such a surface is supported by an insulating substrate. The insulating substrate is suitably a dimensionally stable plastics board, for example of epoxy resin reinforced by glass fibers. There may be a conductive surface on one or both sides of the insulating substrate.

Whilst the said surface defined herein may be an insulator requiring to be selectively subjected to etching in order to remove portions thereof to reveal an electroactive layer beneath it, preferably the said surface itself is an electroactive layer. By electroactive we mean a conductor, a semiconductor or a material which when doped functions as a semiconductor. Most preferably the said surface is conductive. It may suitably be a metallic sheet of thickness not exceeding 200 µm, preferably not exceeding 100 µm, most preferably not exceeding 30 µm.

When, as is preferred, an insulating substrate is provided, to support a conductive sheet on one or both sides thereof, the total thickness of the part, prior to application of a said coating, including the conductive sheet or sheets, preferably does not exceed 500 µm, and more preferably does not exceed 300 µm.

A preferred part has a metal-insulator-metal sandwich structure.

According to a second aspect of the invention there is provided a precursor for an electronic part, which precursor comprises a surface (not being an aluminium surface which has undergone electrograining, anodising and post-anodic treatments) and a coating carried by the said surface, the coating being as defined above with reference to the first aspect.

In order to increase the sensitivity of the heat-sensitive compositions used in the present invention it is beneficial to include an additional component, namely a radiation absorbing compound capable of absorbing incident radiation and converting it to heat, hereinafter called a "radiation absorbing compound". A radiation absorbing compound is suitably a dye or pigment.

Therefore according to a further aspect of the present invention there is provided a precursor for an electronic part wherein said coating is adapted to preferentially absorb radiation and convert said radiation to heat.

In one embodiment of the present invention there is provided a heat-sensitive positive working precursor for an electronic part wherein the said coating includes an additional layer disposed beneath the heat-sensitive composition, wherein the additional layer comprises a radiation absorbing compound.

In one embodiment of the present invention there is provided a heat-sensitive positive working precursor for an electronic part which has on said surface a coating comprising a heat-sensitive composition comprising a said aqueous developer soluble polymeric substance and a said reversible insolubilizer compound which is also a said radiation absorbing compound.

In the specification, when we state that the aqueous developer solubility of the composition is increased on heating we mean that it is substantially increased, i.e. by an amount useful in an electronic part manufacturing process.

Preferably the aqueous developer solubility of the composition is not increased by incident UV radiation. When we state that the aqueous developer solubility of the composition is not increased by incident UV radiation we mean that it is not substantially increased (that is, by an amount which would mean that UV safelighting conditions would have to be employed) over a time span applicable to the manufacturing process involved—which in the case of electronic part manufacture means over a time span of up to 2 hours, preferably up to 6 hours, most preferably up to 24 hours. Insubstantial increases in solubility due to incident UV radiation, arising from ambient light, for example arising from daylight or ordinary white lights such as fluorescent strip lights, over such periods, may be tolerated within the scope of this invention.

Preferably the composition is applied as a liquid to the surface of the electronic part precursor and dried. The resultant coated precursor is preferably used "fresh", that is, it is imaged, by the patternwise delivery of heat, within 14 days, preferably within 7 days, more preferably within 4 days (ie 96 hours), of the application of the composition, to the surface.

Thus in accordance with the present invention an electronic part, whether a circuit or a circuit device, is obtained after heat-mode imaging and processing. The aqueous developer solubility of the coated composition is substantially reduced with respect to the solubility of the corresponding composition without the reversible insolubilizer compound. On subsequent exposure to suitable radiation the heated areas of the composition are rendered more soluble in the developing solution. Therefore on imagewise exposure there is a change in the solubility differential of the unexposed composition and of the exposed composition. Thus, in the exposed areas the composition is dissolved, preferably to the extent of revealing the underlying surface. The revealed areas of the underlying surface can then be selectively subjected to a desired treatment, which in the case of electronic parts may entail etching, doping and/or deposition, and/or making electrical connections thereto. Desirably, after such treatment, the remaining areas of the composition are then removed. This may be achieved by heating the precursor to solubilise the remaining areas of the composition, then subjecting it to a developer; or, preferably, by subjecting it to a stripper liquid, for example acetone or strong alkali, for example an alkali metal hydroxide.

In accordance with a further aspect of the invention there is provided a kit for the production of electronic part precursors, the kit comprising a composition as defined herein, and surface material, the composition being in liquid form suitable for application to the surface material, to provide it on drying with said coating. Preferably the composition is supplied in a solvent, which is driven off during a drying step, to leave the composition in the form of a solid layer or film. Suitable solvents include 1-methoxypropan-2-ol and 1-methoxy-2-propyl acetate. The amount of solvent used depends upon various parameters, for example the nature of the solvent and of the components of the composition, the coating weight and thickness required, and the coating technique employed. Generally it is desired to minimize the amount of solvent used. When a pigment is used as a radiation absorbing compound it is suitably milled, preferably with some or all of the polymer(s) of the composition. The solids content of such a composition, as applied, is preferably 10–40%, especially 15–30%, by total weight of the composition (including solvent). Such a composition suitably has a particle size of less than 10 µm, more preferably less than 5 µm, most preferably less than 1 µm, as determined by grind gauge. Preferably the surface material is a conductive material. Suitably the kit includes a developer. Suitably the kit includes a stripper liquid. Alternatively the kit may include a single liquid which can function as a developer and a stripper.

Alternatively a precursor may be supplied with a said composition already provided as a coating thereon.

We will now describe further the formation of a desired pattern on a precursor, by means of a method as defined above. The composition thereon is such that it is patternwise solubilized by heat, itself delivered patternwise. In broad terms there are three ways in which heat can be patternwise delivered to the composition, in use. These are:

the direct delivery of heat by a heated body, by conduction. For example the composition may be contacted by a heat stylus; or the reverse face of a metallic support surface onto which the composition has been coated may be contacted by a heat stylus.

the use of incident electromagnetic radiation to expose the composition, the electromagnetic radiation being converted to heat, either directly (which is preferred) or by a chemical reaction undergone by a component of the composition.

the use of charged-particle radiation, for example electron beam radiation. Clearly, at the fundamental level the charged-particle mode and the electromagnetic mode are convergent; but the distinction is clear at the practical level.

A coated precursor for an electronic part of the invention may be heat imaged indirectly by exposure to a short duration of high intensity radiation transmitted or reflected from the background areas of a graphic original located in contact with the recording material.

In preferred methods of the invention electromagnetic radiation is used to expose the composition, the wavelength thereof entirely or predominantly exceeding 500 nm. Preferably, it is of wavelength entirely or predominantly exceeding 600 nm. More preferably it is of wavelength entirely or predominantly exceeding 700 nm. Most preferably it is of wavelength entirely or predominantly exceeding 800 nm. Suitably it is of wavelength entirely or predominantly below 1400 nm. More preferably it is of wavelength entirely or predominantly below 1200 nm. Most preferably it is of wavelength entirely or predominantly below 1150 nm, especially below 1100 nm. Thus, suitably it is of wavelength entirely or predominantly in the range 600 to 1400 nm, more preferably 700 to 1200 nm, most preferably 800 to 1150 nm, especially 800 to 1100 nm. The electromagnetic radiation is converted to heat, either directly or by a chemical reaction undergone by a component of the composition. The electromagnetic radiation could for example be infra-red or visible radiation. Infra-red radiation is preferred.

Preferably the radiation is delivered by a laser.

Whilst the applicants do not wish to be limited by any theoretical explanation of how their invention operates, it is believed that a thermally frangible complex is formed between the aqueous developer soluble polymeric substance and the reversible insolubilizer compound. This complex is believed to be reversibly formed and can be broken by application of heat to the complex to restore aqueous developer solubility to the composition. It is thought that polymeric substances suitable for use in the current invention comprise electron rich functional groups when uncomplexed and that suitable compounds which reduce the aqueous developer solubility of the polymeric substance are electron poor. It is not thought that decomposition of components within the composition is required, or that any substantial decomposition has occurred in any examples tested to date.

In contrast to compositions used on printing plates, compositions used in the present invention may suitably be non-oleophilic.

In relation to the polymer of general formula I the following definitions apply.

In general terms, any alkyl group is suitably a $C_{1-12}$ alkyl group, preferably a $C_{1-6}$ alkyl group, especially a $C_{1-4}$ alkyl group. Alkyl groups having 3 or more carbon atoms may be branched (for example t-butyl) or straight chain (for example n-butyl).

$R^1$ preferably represents a hydrogen atom or a $C_{1-4}$ alkyl group, especially a methyl group. Most preferably $R^1$ represents a hydrogen atom.

$R^2$ preferably represents a hydrogen atom or a $C_{1-4}$ alkyl group, especially a methyl group. Most preferably $R^2$ represents a hydrogen atom.

The hydroxy substituent of the phenyl group shown is preferably located para to the linkage of the phenyl group to the polymer backbone.

$R^3$ preferably represents a hydrogen atom or a $C_{1-4}$ alkyl group, especially a methyl group. Most preferably $R^3$ represents a hydrogen atom.

$R^4$ preferably represents a $C_{1-6}$ alkyl or $C_{1-6}$ hydroxyalkyl group. When it represents a hydroxyalkyl group the hydroxy group is preferably carried by the terminal carbon atom of the alkyl group. Examples of suitable groups $R^4$ are —$CH_3$, —$CH_2CH_2OH$, and —$CH_2CH_2CH_2CH_3$.

Preferably the ratio n/m is in the range 5/1 to 1/2. More preferably the ratio n/m is in the range 2/1 to 2/3. Most preferably the ratio n/m is in the range 3/2 to 2/3, especially 1/1.

The weight average molecular weight $M_w$ of the polymer of general formula I, as measured by gel permeation chromatography, is preferably in the range 5,000–75,000, especially 7,000–50,000.

The number average molecular weight $M_n$ of the polymer of general formula I is preferably in the range 2,000–20,000, especially 3,000–8,000.

The polymer of general formula I may be the only polymer used in the composition or it may be used in admixture with one or more other polymeric substances. In this event it preferably constitutes at least 20% of the weight of the composition, preferably at least 50%, most preferably at least 70%. There may be more than one polymer of general formula I. References herein to the proportion of such polymer(s) are to their total content.

Other polymeric substances may be, for example, novolac resins and poly(4-hydroxystyrene).

Particularly good results have been obtained with compositions comprising a polymer of general formula I, and 0 to 40%, preferably 10 to 30%, by weight of the total weight of the composition, of an additional polymer, preferably poly(4-hydroxystyrene).

A large number of compounds have been located for use as reversible insolubilizer compounds.

A useful class of reversible insolubilizer compounds are nitrogen containing compounds wherein at least one nitrogen atom is either quarternised, or incorporated in a heterocyclic ring, or both quarternised and incorporated in a heterocyclic ring.

Examples of useful quarternised nitrogen containing compounds are triaryl methane dyes such as Crystal Violet (CI basic violet 3) and Ethyl Violet and tetraalkyl ammonium compounds such as Cetrimide. Especially preferred is Crystal Violet.

More preferably the reversible insolubilizer compound is a nitrogen-containing heterocyclic compound.

Examples of suitable nitrogen-containing heterocyclic compounds are quinoline and triazols, such as 1,2,4-triazol.

Most preferably the reversible insolubilizer compound is a quarternised heterocyclic compound.

Examples of suitable quarternised heterocyclic compounds are imidazoline compounds, such as Monazoline C, Monazoline O, Monazoline CY and Monazoline T all of which are manufactured by Mona Industries, quinolinium compounds, such as 1-ethyl-2-methyl quinolinium iodide and 1-ethyl-4-methyl quinolinium iodide, and benzothiazolium compounds, such as 3-ethyl-2-methyl benzothiazolium iodide, and pyridinium compounds, such as cetyl pyridinium bromide, ethyl viologen dibromide and fluoropyridinium tetrafluoroborate.

Usefully the quinolinium or benzothiazolium compounds are cationic cyanine dyes, such as Quinoldine Blue, 3-ethyl-2-[3-(3-ethyl-2(3H)-benzothiazoylidene)-2-methyl-1-propenyl]benzothiazolium iodide, and the compound of formula A further useful class of reversible insolubilizer compounds are carbonyl functional group containing compounds, for example a flavone compound.

Examples of suitable carbonyl containing compounds are α-naphthoflavone, β-naphthoflavone, 2,3-diphenyl-1-indeneone, flavone, flavanone, xanthone, benzophenone, N-(4-bromobutyl)phthalimide and phenanthrenequinone.

The reversible insolubilizing compound may be a compound of general formula where $Q_1$ represents an optionally substituted phenyl or alkyl group, n represents 0, 1 or 2, and $Q_2$ represents a halogen atom or an alkoxy group. Preferably $Q_1$ represents a $C_{1-4}$ alkyl phenyl group, for example a tolyl group, or a $C_{1-4}$ alkyl group. Preferably n represents 1 or, especially, 2. Preferably $Q_2$ represents a chlorine atom or a $C_{1-4}$ alkoxy group, especially an ethoxy group. The compound may suitably be ethyl-p-toluene sulfonate or p-toluenesulfonyl chloride.

Another useful reversible insolubilizer compound is acridine orange base (CI solvent orange 15).

Other useful reversible insolubilizer compounds are ferrocenium compounds, such as ferrocenium hexafluorophosphate.

Suitably the reversible insolubilizer compound constitutes at least 0.25%, preferably at least 0.5%, more preferably at least 1%, most preferably at least 2%; and preferably up to 25%, more preferably up to 15%, and most preferably up to 10%, of the total weight of the composition. There may be more than one reversible insolubilizer compound. References herein to the proportion of such compound(s) are to their total content.

The aqueous developer composition is dependent on the nature of the polymeric substance. Common components of aqueous lithographic developers are surfactants, chelating agents such as salts of ethylenediamine tetraacetic acid, organic solvents such as benzyl alcohol, and alkaline components such as inorganic metasilicates, organic metasilicates, hydroxides or bicarbonates.

Preferably the aqueous developer is an alkaline developer containing inorganic or organic metasilicates or being an alkali metal hydroxide. We have found an alkali metal hydroxide, for example sodium hydroxide or potassium hydroxide, to be suitable both as a developer and as a stripper.

A large number of compounds, or combinations thereof, can be utilised as radiation absorbing compounds in preferred embodiments of the present invention.

In preferred embodiments the radiation absorbing compound absorbs infra-red radiation, for example 1064 nm radiation from a Nd-YAG laser. However, other materials which absorb other wavelength radiation e.g. 488 nm radiation from a Ar-ion laser source, may be used with the radiation being converted to heat.

The radiation absorbing compound may usefully be a pigment, which is a black body or broad band absorber. It may be carbon such as carbon black or graphite. It may be a commercially available pigment such as Heliogen Green as supplied by BASF or Nigrosine Base NG1 as supplied by NH Laboratories Inc or Milori Blue (C.I. Pigment Blue 27) as supplied by Aldrich.

The radiation absorbing compound may usefully be an infra-red absorbing dye able to absorb the radiation selected for imaging and convert it to heat.

Preferably the infra-red absorbing compound is one whose absorption spectrum is significant at the wavelength output of the laser which is (in preferred embodiments) to be used in the method of the present invention. Usefully it may be an organic pigment or dye such as phthalocyanine pigment. Or it may be a dye or pigment of the squarylium, merocyanine, cyanine, indolizine, pyrylium or metal dithioline classes.

Examples of such compounds are:

and SDB7047, believed to have the structure:

and KF 654B PINA, believed to have the structure:

KF 654B PINA is an especially preferred component of compositions used in the present invention, and functions as a reversible insolubilizer compound as well as an absorber.

Pigments are generally insoluble in the compositions and so comprise particles therein. Generally they are broad band absorbers, preferably able efficiently to absorb electromagnetic radiation and convert it to heat over a range of wavelengths exceeding 200 nm, preferably exceeding 400 nm. Generally they are not decomposed by the radiation. Generally they do not have any marked effect on the solubility of the unheated composition, in the developer. In contrast dyes are generally soluble in the compositions. Generally they are narrow band absorbers, typically able efficiently to absorb electromagnetic radiation and convert it to heat only over a range of wavelengths typically not exceeding 100 nm, and so have to be selected having regard to the wavelength of the radiation which is to be used for imaging. Frequently they have a marked effect on the solubility of the unheated composition in the developer, typically making it much less soluble.

Suitably the radiation absorbing compound, when present, constitutes at least 0.25%, preferably at least 0.5%, more preferably at least 1%, most preferably at least 2%, of the total weight of the composition. Suitably the radiation absorbing compound, when present, constitutes up to 25%, preferably up to 20%, and most preferably up to 15%, of the total weight of the composition. More specifically, in the case of dyes the range may preferably be 0.25–15% of the total weight of the composition, preferably 0.5–8%, whilst in the case of pigments the range may preferably be 1–25%, preferably 2–15%. For pigments, 5–15% may be especially suitable. In each case the figures given are as a percentage of the total weight of the dried composition. There may be more than one radiation absorbing compound. References herein to the proportion of such compound(s) are to their total content.

In one preferred embodiment of the invention an additional layer comprising a radiation absorbing compound can be used. This multiple layer construction can provide routes to high sensitivity as larger quantities of absorber can be used without affecting the function of the imaging forming layer. In principle any radiation absorbing material which absorbs sufficiently strongly in the desired wavelength can be incorporated or fabricated in a uniform coating. Dyes, metals and pigments (including metal oxides) may be used in the form of vapour deposited layers, techniques for forming and use of such films are well known in the art, for example EP 0,652,483.

Compounds which reduce the aqueous developer solubility of the polymeric substance and are also radiation absorbing compounds suitable for one embodiment of the present invention are preferably cyanine dyes and most preferably quinolinium cyanine dyes which absorb at above 600 nm.

Examples of such compounds are:

2-[3-chloro-5-(1-ethyl-2(1H)-quinolinylidene)-1,3-pentadienyl]-1-ethylquinolinium bromide 1-ethyl-2-[5-(1-ethyl-2(1H)-quinolinylidene)-1,3-pentadienyl]quinolinium iodide 4-[3-chloro-5-(1-ethyl-4(1H)-quinolinylidene-1,3-pentadienyl]-ethylquinolinium iodide, 1-ethyl-4-[5-(1-ethyl-4(1H)-quinolinylidene)-1,3-pentadienyl]quinolinium iodide Suitably the reversible insolubilizer compound which is also a radiation absorbing compound constitutes at least 1%, preferably at least 2%, preferably up to 25%, more preferably up to 15%, of the total weight of the composition. Thus a preferred weight range for the reversible insolubilizer compound which is also a radiation absorbing compound may be expressed as 2–15% of the total weight of the composition.

The compositions of the invention may contain other ingredients such as stabilising additives, surfactants, plasticisers, inert colourants, additional inert polymeric binders as are present in many radiation sensitive compositions.

Preferably the heat-sensitive compositions of the present invention do not comprise UV sensitive components, such as NQD moieties and onium salts. However, UV sensitive components which are not UV activated due to the presence of other components, such as inert UV absorbing dyes or a UV absorbing topmost layer, may be present.

It is important that the entire surface of the precursor before development is covered by the heat-sensitive composition, and that the non-heated areas of the surface after development remain covered.

Preferably the mean peak to valley height Rz (as measured by test DIN 4777) of the surface of the precursor to which the composition is applied is less than 5 μm, preferably less than 2 μm (when measured in any direction).

Prior to the application of the coating to the precursor the precursor is preferably treated with a cleaning or anti-tarnishing agent, suitably an acid, for example aqueous citric acid, then rinsed thoroughly and dried.

Preferably the sensitivity of the preferred compositions should be at a practicable level but suitably no more than 600 mJcm$^{-2}$, preferably no more than 400 mJcm$^{-2}$, more preferably no more than 300 mJcm$^{-2}$.

Any feature of any aspect of the present invention or embodiment described herein may be combined with any feature of any other aspect of any invention or embodiment described herein.

The following Examples more particularly serve to illustrate the various aspects of the present invention described hereinabove. With reference to the Examples.

The following products are referred to hereafter:

Resin A—Lyncur CBA (PVP-butylacrylate), a copolymer of p-vinylphenol having the structure:

n/m=8/2–6/4, Mw=10,000–30,000
Mn=5,000–5,500
as supplied by Siber Hegner Ltd, Beckenham, UK.

Resin B—Lyncur CHM (PVP-hydroxyethylmethacrylate), a copolymer of p-vinylphenol, having the structure:

n/m–1/1, Mw=7,000–14,000
Mn=3,000–5,500
as supplied by Siber Hegner.

Resin D—Lyncur M(S-2), a p-vinylphenol polymer having Mw=4,000–6,000 and Mn=2,100–3,100, as supplied by Siber Hegner.

Resin E—LB6564, a 1:1 phenol/cresol novolac resin supplied by Bakelite, UK.

Resin F—LB744, a cresol novolac resin supplied by Bakelite.

Dye A—KF654B PINA as supplied by Riedel de Haan UK, Middlesex, UK, believed to have the structure stated above.

Dye B—crystal violet (basic violet 3, C.I.42555, Gentian Violet) as supplied by Aldrich Chemical Company of Dorset, UK, having the structure:

Dye C—SDB7047 as supplied by HW Sands of Jupiter, Fla., USA, believed to have the structure stated herein above.

Prussian Blue (ferric ferrocyanide, CI Pigment Blue 27) supplied by Aldrich.

Flavanone—2,3-Dihydroxyflavone supplied by Aldrich.

Etching Solution A—Ferric chloride hexahydrate (FeCl$_3$.6H$_2$O) crystals, catalogue No. 551-227 as supplied by RS Components, Corby, UK.

Stripper A—catalogue No. 690-855 as supplied by RS Components, Corby, UK.

Developer A—14wt % sodium metasilicate pentahydrate in water.

Developer C—10.5 wt % sodium metasilicate pentahydrate in water.

Developer D—0.2M NaOH in water.

Developer E—5% wt sodium carbonate in water.

Copper Substrate A—double sided copper laminate of overall thickness 254 μm, having copper cladding 18 μm thick on each side of an insulating substrate, catalogue number N4105-2, 0.008, H/H HTE, as supplied by New England Laminates (UK) Limited of Skelmersdale, UK.

Copper Substrate B—double sided copper laminate of overall thickness 254 μm, having reverse foil treated copper cladding 18 μm thick on each side of an insulating substrate, catalogue number N4105-2,0.008, H/H MLS, as supplied by New England Laminates.

In all cases Copper Substrate A was brush grained using a mechanical brush grainer, stock number 4428, supplied by PCB Machinery Limited, Haslingden, Rossendale, UK, rinsed with distilled water for 10 seconds and allowed to air dry, prior to coating. Copper Substrate B was not brush grained, having already a suitable surface morphology, but was rinsed with distilled water and allowed to dry in air, prior to coating.

Creo Trendsetter 3244—a commercially available plate setter, using Procomm Plus Software, operating at a wavelength of 830 nm at powers of up to 8 W and supplied by Creo Products Inc. of Burnaby, Canada.

In each example imaging was carried out 1 day (which may be taken to mean 24 hours±4 hours) after coating.

EXAMPLES 1 TO 4

The coating formulations for Examples 1 to 4 were prepared as solutions in 1-methoxypropan-2-ol.

The substrate used was Copper Substrate A. The coating solutions were coated onto one side of the substrate by means of a wire wound bar.

In Example 1, the solution concentration was selected to provide the specified dry film composition with a coating weight of 3.0 gm$^{-2}$ after thorough drying, at 130° C. for 150 seconds.

In Example 2, the solution concentration was selected to provide the specified dry film composition with a coating weight of 2.5 gm$^{-2}$ after drying as above.

In Example 3, the solution concentration was selected to provide the specified dry film composition with a coating weight of 2.5 gm$^{-2}$ after thorough drying, at 130° C. for 120 seconds.

In Example 4, the solution concentration was selected to provide the specified dry film composition with a coating weight of 3.0 gm$^{-2}$ after thorough drying, at 130° C. for 150 seconds.

The compositions were as set out in Table 1 below.

TABLE 1

| Component | Examples | | | |
|---|---|---|---|---|
| | 1 | 2 | 3 | 4 |
| Resin A | 75 | 60 | 94 | |
| Resin B | | | | 75 |
| Resin D | 22.2 | | | 21 |
| Dye B | 1 | 2 | 2 | 2 |
| Dye A | 1.8 | 2 | 2 | 2 |
| Resin F | | 36 | | |
| Flavanone | | | | 2 |

EXAMPLE 1

A sample of the printed circuit board precursor was imaged in the Trendsetter 3244, using the internal test pattern, plot 0 at 8 W, 350 mJcm$^{-2}$, 58 rpm.

The exposed precursor was then processed by immersing in Developer D for 30 seconds at 38° C. At this imaging and developing condition, the 50% dots laid down by the platesetter were complete 50% dots on the substrate.

The precursor was then etched (uncovered copper removed) by immersion in the Etching Solution A, diluted with water (50% w:w) which was constantly being stirred for between 5 and 10 minutes at 40° C. The precursor was then rinsed in water.

Finally, the precursor was cleaned by immersion in Stripper A diluted with water (20% w:w) (to remove the remaining novolac) at 20° C. for 60 seconds. The printed circuit board sample had a copper pattern remaining that was an accurate copy of the precursor above after the development stages.

EXAMPLE 2

A sample of the precursor was imaged on the Trendsetter 3244, using the internal test pattern, plot 0 at 8 W, 400 mJcm$^{-2}$, 50 rpm.

The exposed precursor was then processed by immersing in Developer A for 30 seconds at 22.5° C. At this imaging and developing condition, the 50% dots laid down by the platesetter were complete 50% dots on the substrate.

EXAMPLE 3

A sample of the precursor was imaged on the Trendsetter 3244, using the internal test pattern, plot 0 at 8 W, 300 mJcm$^{-2}$, 68 rpm.

The exposed precursor was then processed by immersing in Developer C for 45 seconds at 22.5° C. At this imaging and developing condition, the 50% dots laid down by the platesetter were complete 50% dots on the substrate.

EXAMPLE 4

A sample of the precursor was imaged on the Trendsetter 3244, using the internal test pattern, plot 0 at 8 W, 400 mJcm$^{-2}$, 50 rpm.

The exposed precursor was then processed by immersing in Developer E for 120 seconds at 30° C. At this imaging and developing condition, the 50% dots laid down by the platesetter were complete 50% dots on the substrate.

EXAMPLES 5 AND 6

In example 5 Prussian Blue and Resin E (at a ratio of 1:4, w:w) were ball milled together for four days such that the dispersed mill-base had a solids content of 30 wt % in 1-methoxy-2-propyl acetate and a particle size of <10 microns as determined by grind gauge. Subsequently, the coating formulation for example 5 was prepared as a solution in 1-methoxypropan-2-ol:1-methoxy-2-propyl acetate (50:50, w:w).

In example 5 the solution concentration was selected to provide the specified dry film composition with a coating weight of 5.0 gm$^{-2}$ after thorough drying, at 130° C. for 150 seconds.

In example 6, the solution concentration was selected to provide the specified dry film composition with a coating weight of 3.0 gm$^{-2}$ after thorough drying, at 130° C. for 150 seconds.

The compositions were as set out in Table 2 below.

In each case the substrate used was Copper Substrate A, and the coating solutions were coated onto one side by means of a wire wound bar.

TABLE 2

| Component | Examples | |
|---|---|---|
| | 5 | 6 |
| Resin E | 73 | |
| Resin A | 20 | 75 |
| Dye B | 1 | 2 |
| Prussian Blue | 6 | |
| Resin D | | 21.2 |
| Dye C | | 1.8 |

EXAMPLE 5

A sample of the printed circuit board precursor was imaged on the Trendsetter 3244, using the internal test pattern, plot 0 at 8W, 300 mJcm$^{-2}$, 68 rpm.

The exposed precursor was then processed by immersing in Developer D for 30 seconds at 38° C. At this imaging and developing condition, the 50% dots laid down by the platesetter were complete 50% dots on the substrate.

EXAMPLE 6

A sample of the printed circuit board precursor was imaged on the Trendsetter 3244, using the internal test pattern, plot 0 at 8W, 200 mJcm$^{-2}$, 102 rpm.

The exposed precursor was then processed by immersing in Developer D for 60 seconds at 38° C. At this imaging and developing condition, the 50% dots laid down by the platesetter were complete 50% dots on the substrate.

EXAMPLES 7 AND 8

In example 7, Prussian Blue and Resin E (at a ratio of 1:4, w:w) were ball milled together for four days such that the dispersed mill-base had a solids content of 30 wt % in 1-methoxy-2-propyl acetate and a particle size of <10 microns as determined by grind gauge. Consequently, the coating formulation for example 8 was prepared as a solution in 1-methoxypropan-2-ol:1-methoxy-2-propyl acetate (50:50, w:w).

The coating formulation in Example 8 below was prepared as a solution in 1-methoxypropan-2-ol.

The substrate used was Copper Substrate B. The coating solution was coated onto one side by means of a wire wound bar.

The solution concentration was selected to provide the specified dry film composition with a coating weight of 5.0 $gm^{-2}$ for example 7 and 6.0 $gm^{-2}$ for example 8 after thorough drying, at 130° C. for 180 seconds.

The compositions were as set out in Table 4 below.

TABLE 4

| | Examples | |
|---|---|---|
| | 7 | 8 |
| Component | Parts by weight | |
| Resin A | 20 | 55 |
| Resin D | | 41 |
| Resin E | 73 | |
| Dye A | | 1.2 |
| Dye B | 1 | 2.8 |
| Prussian Blue | 6 | |

A sample of the printed circuit board precursor was imaged on the Trendsetter 3244, using the internal test pattern, plot 0 at 8W, 200 $mJcm^{-2}$, 102 rpm for example 7 and at 8W, 400 $mJcm^{-2}$, 51 rpm for example 8.

The exposed precursors were then processed by immersing in Developer D for 30 seconds at 38° C. At this imaging and developing condition, the 50% dots laid down by the platesetter were complete 50% dots on the substrate.

EXAMPLE 9

The coating formulation in Example 9 was prepared as a solution in 1-methoxypropan-2-ol. The % solids was measured at 17.5 wt %, and 1 liter was required for the apparatus to function. The composition was as set out in Table 5 below.

TABLE 5

| Component | Parts by weight |
|---|---|
| Resin A | 75 |
| Resin D | 22.2 |
| Dye A | 1.8 |
| Dye B | 1 |

The coating formulation was decanted into a dip coater reservoir (a Kepro bench-top coater, model BTC-101E as supplied by Kepro Circuit Systems Inc, of Fenton, Mo., USA), and its temperature maintained at 20° C. A sample of Copper Substrate A (45×11 cm) was then attached to the moving platform of the apparatus and lowered into the reservoir of the coating formulation at the standard machine descent rate. The substrate was consequently lifted out of the reservoir at a rate of 0.25 $cms^{-1}$ at 20° C. to leave the heat sensitive coating covering both sides of the copper substrate and it was then suspended in an oven and dried at 130° C. for 150 seconds, leaving a dry coating film weight of 3.0 $gm^{-2}$ on each side.

Each coated side of the printed circuit board precursor was imaged in the Trendsetter 3244 (one side loaded and imaged, then unloaded and turned around and repeated), using the internal test pattern, plot 0 at 8W, 350 $mJcm^{-2}$, 58 rpm.

The exposed double-sided precursor was then processed by immersing in Developer D for 30 seconds at 38° C. At this imaging and developing condition, the 50% dots laid down by the platesetter were complete 50% dots on both sides of the substrate. No damage was discernible on either side of the substrate arising from the contact made with the side not being imaged, during the two-stage imaging.

EXAMPLES 10 TO 12

The coating formulations in these Examples were prepared as solutions in 1-methoxypropan-2-ol. The solution was applied to one side of Copper Substrate A by a wire wound bar, and the solution concentration was selected to provide the specified dry film composition with a coating weight of 3.0 $gm^{-2}$ after thorough drying at 130° C. for 150 seconds. The compositions were as set out in Table 6 below. Example 10 is in accordance with the invention and Examples 11 and 12 are not, being present for comparison purposes.

TABLE 6

| | Examples | | |
|---|---|---|---|
| Component | 10 | 11 | 12 |
| Dye A | 1.8 | 1.8 | 1.25 |
| Dye B | 1.0 | 2.0 | 5.5 |
| Resin A | 75.0 | | |
| Resin D | 22.2 | 60.0 | |
| Resin F | | 36.2 | |
| Resin E | | | 93.25 |

The coated substrates were subjected to a scratch test using a DUR-O-Test instrument manufactured by BYK-Gardner GmbH, of Geretsried, Germany.

The instrument consists of a sleeve containing a pressure spring that can be compressed to various tensions by means of a slide. This spring acts upon a protruding tungsten carbide needle. The spring can be replaced in order to change the force available to the user. For these tests, the red spring was used giving a force of 0–10 Newtons. The needle of the instrument was placed perpendicularly onto the coating. A line was drawn approximately 5 cm long within 1 second, whilst pressing the DUR-O-Test instrument against the specimen until the plane jacket end contacted the test surface. If the copper substrate was seen through the coating the specimen failed the test, but if a mark was made on the coating but it did not break through the coating a pass was declared.

Figure 1:
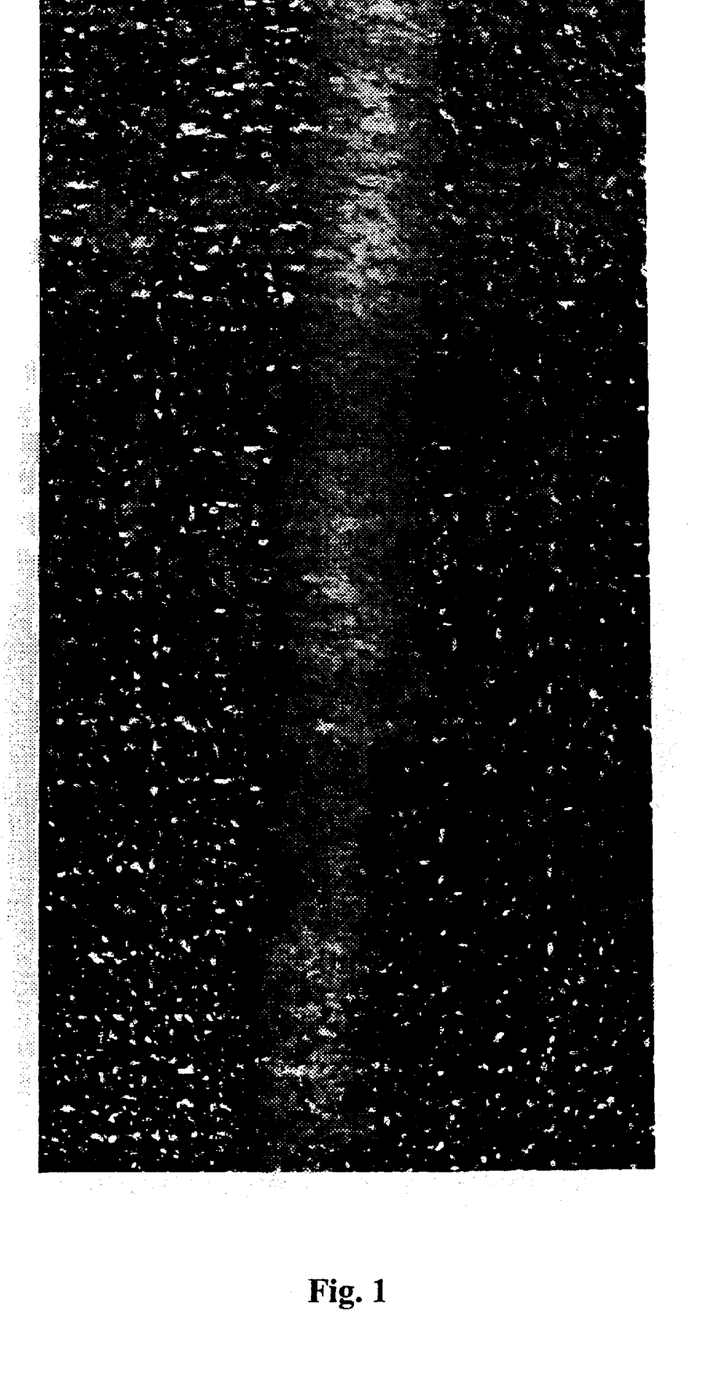
FIGS. 1 to 3 are photomicrographs following scratch tests carried out on copper substrates coated with the compositions set out in Examples 10 to 12, Example 10 being in accordance with the invention and Examples 11 and 12 being comparative examples.
Figure 2:
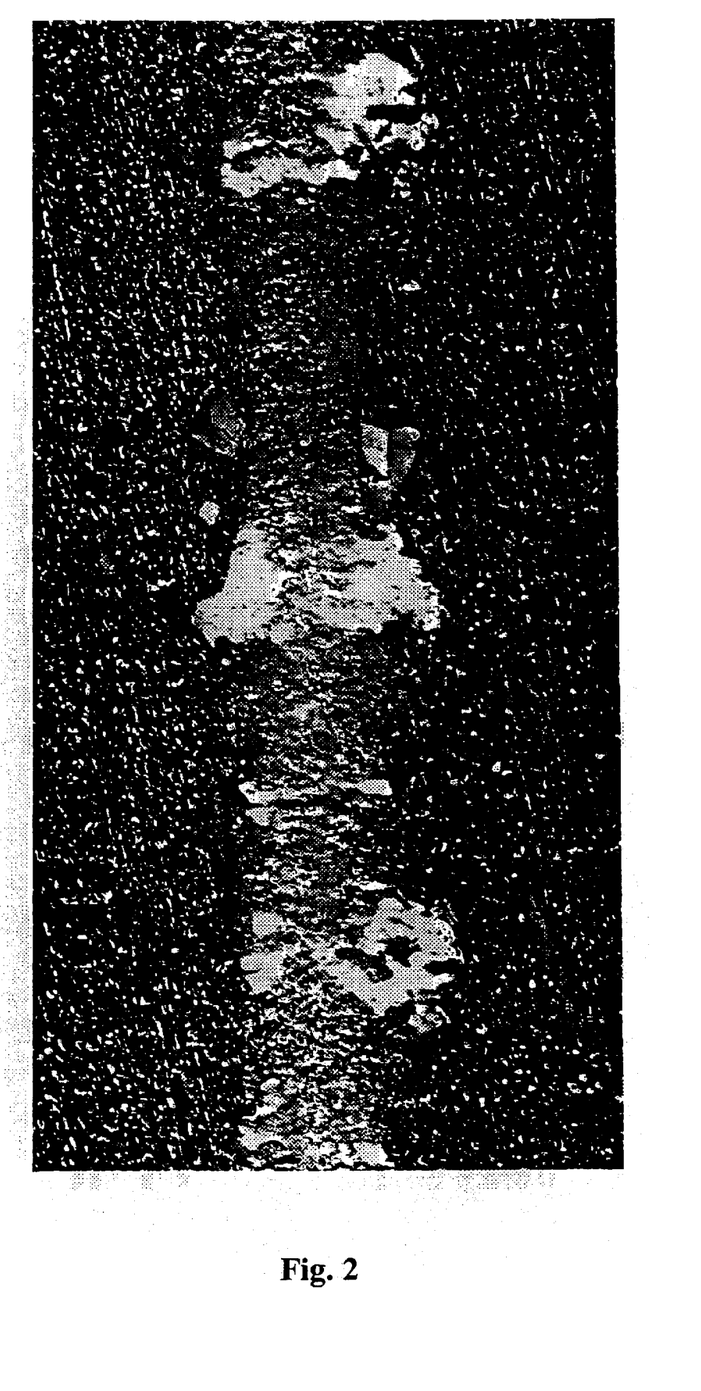
Figure 3:
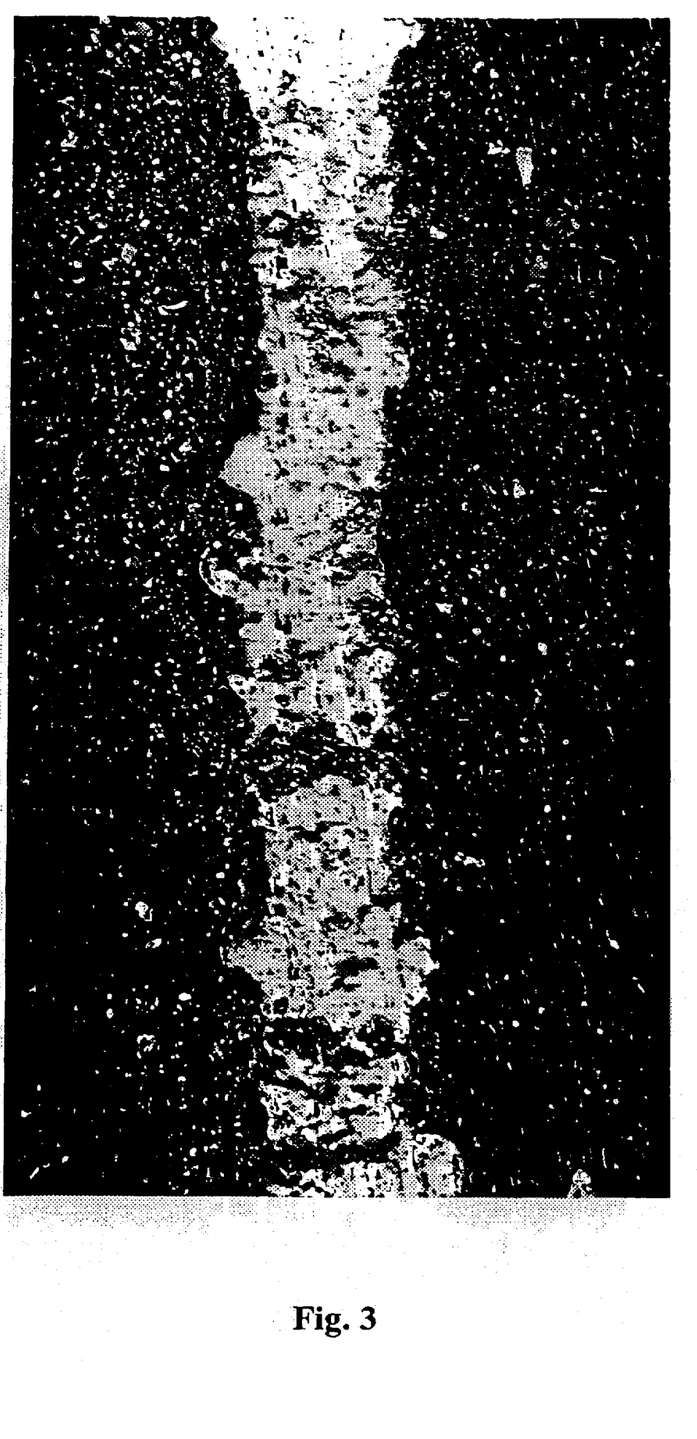

Photomicrographs for Examples 10 to 12 were taken using an Olympus BX60F-3 microscope connected to a JVC 3-CCD colour video camera, No. KY-F55B, using Image-pro plus software from Media Cybernetics, of Maryland, US, a standard Pentium personal computer and a dye sublimation printer. Magnification was 10×. The photomicrographs are shown in FIG. 1 (Example 10), FIG. 2 (Example 11) and FIG. 3 (Example 12). It will be seen that in FIG. 1 a smooth line is shown across the surface, with no cracking or flaking. In FIGS. 2 and 3 irregularities are seen, where the composition has cracked or flaked off. Thus, FIG. 1 shows a pass whilst FIGS. 2 and 3 show failures.

EXAMPLE 13

The surface morphology of Copper Substrates A and B was tested. Measurements were taken with a Hommel Tester 500 using a stylus with a 90° cone angle and a 5 micron tip.

Where there appeared to be a grain, ie a rolling direction from manufacture, measurements were taken along and against (perpendicular to, on the same plane) the grain. There was no grain direction for Copper Substrate B, the reverse treated foil. The surface roughness parameters Ra and Rz were measured in accordance with DIN test 4777 and the instructions given with the instruction manual issued by Hommelwerke GmbH with the Hommel Tester T500. They are defined therein as follows:

Ra Arithmetic mean roughness value:
Arithmetic mean of the profile deviation of the filtered roughness profile from the centre line within the measuring length.

Rz Mean peak to valley height:
Arithmetic mean from the peak to valley heights of 5 successive sampling lengths in filtered roughness profile.

The tests were carried out three times and the results are given in Table 7 below, in microns.

TABLE 7

| Substrate | Measurement direction | Ra 1 | Ra 2 | Ra 3 | Rz 1 | Rz 2 | Rz 3 |
|---|---|---|---|---|---|---|---|
| Copper Substrate A | with grain | 0.18 | 0.18 | 0.18 | 1.42 | 1.26 | 1.46 |
| Copper Substrate A | against grain | 0.22 | 0.26 | 0.22 | 1.82 | 1.46 | 1.84 |
| Copper Substrate B | N/A | 0.56 | 0.64 | 0.62 | 4.16 | 4.56 | 4.56 |

In the specification we refer in various places to UV and infra-red radiation. A person skilled in the art will be aware of the typical wavelength ranges of these radiations, and that there may be latitude at the margins of these ranges, and also that many sources emit a distribution of wavelengths. However, UV radiation typically has a wavelength range not exceeding about 450 nm. Infra-red radiation typically has a wavelength range of at least 600 nm. When we state in this specification that radiation is not UV-radiation we mean that any UV components of the wavelength distribution are minor, not significantly affecting the method. Likewise when we state that radiation is, for example, predominantly infrared radiation we mean that whilst there may be non-infrared components in the wavelength distribution these are not significant, in the method.

All of the features disclosed in this specification (including any accompanying claims, abstract and drawings), and/or all of the steps of any method or process so disclosed, may be combined in any combination, except combinations where at least some of such features and/or steps are mutually exclusive.

Each feature disclosed in this specification (including any accompanying claims, abstract and drawings), may be replaced by alternative features serving the same, equivalent or similar purpose, unless expressly stated otherwise. Thus, unless expressly stated otherwise, each feature disclosed is one example only of a generic series of equivalent or similar features.

The invention is not restricted to the details of the foregoing embodiment(s). The invention extends to any novel one, or any novel combination, of the features disclosed in this specification (including any accompanying claims, abstract and drawings), or to any novel one, or any novel combination, of the steps of any method or process so disclosed.

What is claimed is:

1. A method of making an electronic part, the method comprising:
    a) delivering heat selectively to regions of a precursor of the electronic part, the precursor comprising a surface carrying a coating, the coating comprising a heat-sensitive composition itself comprising an aqueous developer soluble polymeric substance and a reversible insolubilizer compound which reduces the aqueous developer solubility of the polymeric substance wherein the aqueous developer solubility of the composition is increased by the said delivery of heat; and
    b) developing the precursor in a said aqueous developer thereby removing the heat-sensitive composition in regions to which said heat was delivered;
wherein the aqueous developer soluble polymeric substance comprises at least one polymer of general formula wherein $R^1$ is selected from the group consisting of a hydrogen atom and an alkyl group, $R^2$ is selected from the group consisting of a hydrogen atom and an alkyl group, $R^3$ is selected from the group consisting of a hydrogen atom and an alkyl group, and $R^4$ is selected from the group consisting of an alkyl and an hydroxyalkyl group, and wherein the ratio n/m is in the range 10/1 to 1/10.

2. A method as claimed in claim 1, wherein $R^1$ is selected from the group consisting of a hydrogen atom and a $C_{1-4}$ alkyl group, $R^2$ is selected from the group consisting of a hydrogen atom and a $C_{1-4}$ alkyl group, $R^3$ is selected from the group consisting of a hydrogen atom and a $C_{1-4}$ alkyl group and $R^4$ is selected from the group consisting of a $C_{1-6}$ alkyl and a $C_{1-6}$ hydroxyalkyl group.

3. A method as claimed in any one of claim 1 or claim 2, wherein the at least one polymer of general formula I comprises at least 20% by weight of the composition.

4. A method as claimed in any one of claim 1 or claim 2, wherein the composition further comprises at least one selected from the group consisting of a novolac resin and poly(4-hydroxystyrene).

5. A method as claimed in any one of claim 1 or claim 2, comprising delivering radiation to said precursor, wherein said coating comprises a radiation absorbing compound which absorbs the radiation and converts the radiation wherein heat is delivered selectively to said precursor.

6. A method as claimed in claim 5, wherein said reversible insolubilizer compound is a radiation absorbing compound.

7. A method as claimed in claim 5, wherein the radiation is delivered from a laser which emits radiation at above 600 nm.

8. A method as claimed in any of claim 1 or claim 2, wherein the heat is delivered from a heated body.

9. A method as claimed in any one of claim 1 or claim 2, wherein said heat-sensitive composition is applied as a liquid and dried and wherein the interval between applying the composition and delivering heat selectively does not exceed 14 days.

10. A precursor for an electronic part, which comprises a body having a surface which is not an aluminum surface which has undergone electrograining, anodising and post-anodic treatment and a coating on the said surface, the coating being as defined in any of claim 1 or claim 2.

11. A precursor as claimed in claim 10, wherein the precursor absent the coating is of thickness not exceeding 500 μm.

12. A precursor as claimed in any one of claim 10 or claim 11, wherein the body has metal-insulator-metal sandwich structure and wherein the body is coated on both sides with a coating as defined in any of claim 1 or claim 2.

13. A precursor for an electronic part as claimed in any one of claim 10 or claim 11 wherein the surface is includes a material selected from the group consisting of copper and a copper-rich alloy.

14. An electronic part produced by application of a method as claimed in claim 1 to a precursor as claimed in claim 10.

15. A kit for the manufacture of electronic parts, the kit comprising a heat-sensitive composition according to any one of claim 1 or claim 2 and a substrate comprising a surface, the composition being in a liquid form suitable for application to the surface, wherein drying the liquid form on the surface forms a coating.

* * * * *

UNITED STATES PATENT AND TRADEMARK OFFICE
CERTIFICATE OF CORRECTION

PATENT NO. : 6,423,456 B1  
DATED : July 23, 2002  
INVENTOR(S) : Anthony Paul Kitson et al.

It is certified that error appears in the above-identified patent and that said Letters Patent is hereby corrected as shown below:

<u>Column 19,</u>  
Line 12, after "wherein the surface", delete -- is --.

Signed and Sealed this

Twenty-third Day of September, 2003

JAMES E. ROGAN  
*Director of the United States Patent and Trademark Office*